United States Patent
Nagata

(10) Patent No.: US 7,907,459 B2
(45) Date of Patent: Mar. 15, 2011

(54) SEMICONDUCTOR MEMORY DEVICE AND METHOD OF TESTING SAME

(75) Inventor: Shunya Nagata, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 419 days.

(21) Appl. No.: 12/081,013

(22) Filed: Apr. 9, 2008

(65) Prior Publication Data

US 2008/0253209 A1    Oct. 16, 2008

(30) Foreign Application Priority Data

Apr. 12, 2007  (JP) ................. 2007-104828
Mar. 3, 2008   (JP) ................. 2008-052165

(51) Int. Cl.
*G11C 7/00*   (2006.01)
*G11C 8/00*   (2006.01)

(52) U.S. Cl. .................. 365/201; 365/230.05

(58) Field of Classification Search ............. 365/201, 365/230.05, 230.06, 233.1
See application file for complete search history.

(56) References Cited

U.S. PATENT DOCUMENTS

| | | | | |
|---|---|---|---|---|
| 5,530,677 A | * | 6/1996 | Grover et al. | 365/233.12 |
| 6,151,266 A | * | 11/2000 | Henkels et al. | 365/230.06 |
| 6,876,595 B2 | * | 4/2005 | Bhavnagarwala et al. | 365/230.03 |
| 7,042,792 B2 | * | 5/2006 | Lee et al. | 365/230.05 |

FOREIGN PATENT DOCUMENTS

JP    1-296486    11/1989

* cited by examiner

*Primary Examiner* — Anh Phung
(74) *Attorney, Agent, or Firm* — McGinn Intellectual Property Law Group, PLLC

(57) ABSTRACT

Disclosed is a semiconductor memory device in which a cell is connected to word lines of at least first and second ports, and control of timing of activation of the word lines of the first and second ports is performed based upon first and second clock signals, respectively, comprising first and second test control signals in correspondence with the first and second clock signals that control the respective timings of activation of the word lines of the first and second ports. With regard to the cell with the first and second ports being selected, when the first test control signal is in an activated state and the second test control signal is in a deactivated state, control is exercised so as to mask the second clock signal and, responsive to the first clock signal, activate the first and second word lines simultaneously. When the second test control signal is in an activated state and the first test control signal is in a deactivated state, control is exercised so as to mask the first clock signal and, responsive to the second clock signal, activate the first and second word lines.

17 Claims, 8 Drawing Sheets

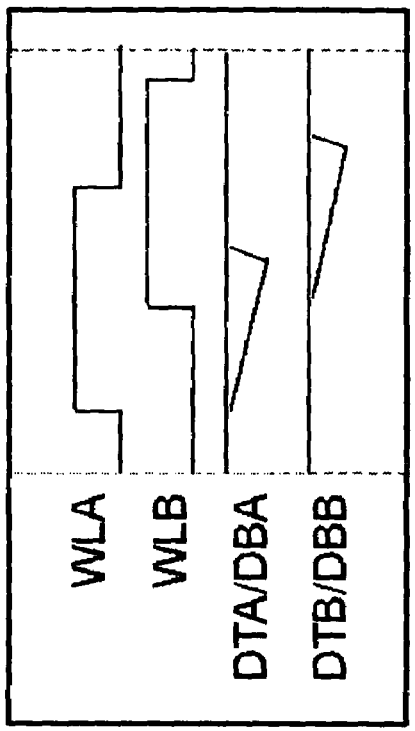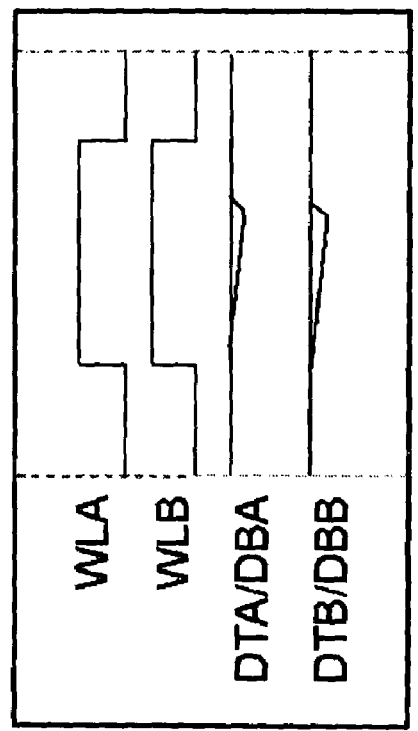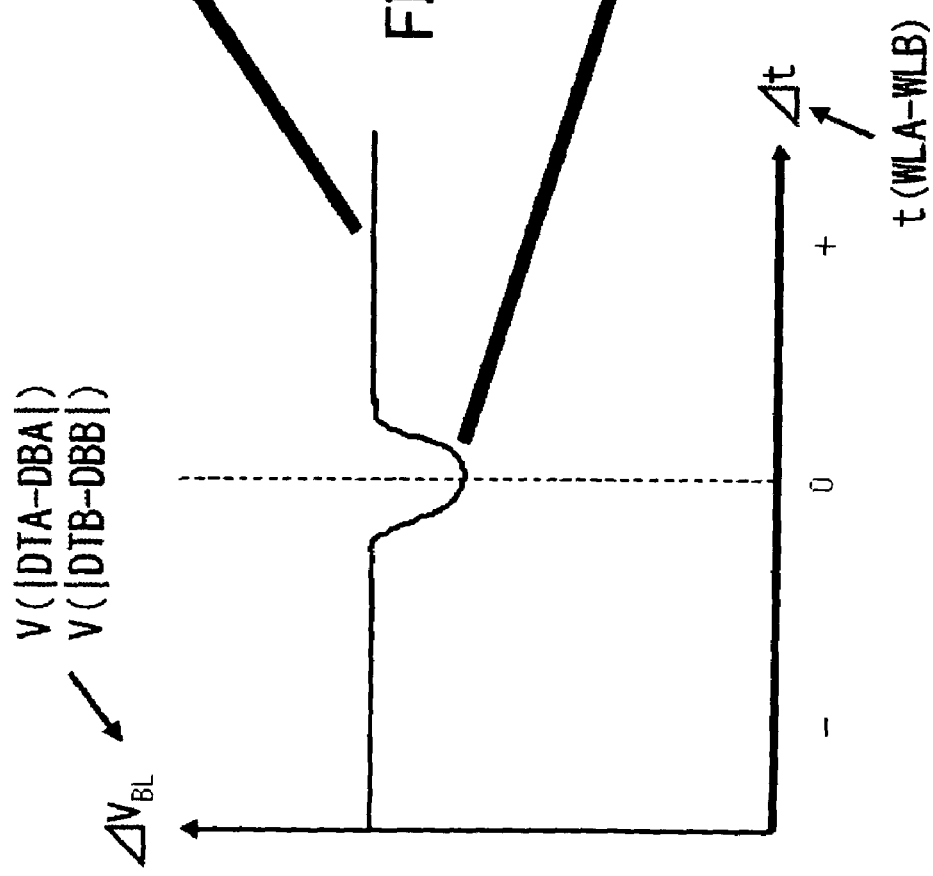
FIG. 5B
FIG. 5C
FIG. 5A

SEMICONDUCTOR MEMORY DEVICE AND METHOD OF TESTING SAME

REFERENCE TO RELATED APPLICATION

The present application is claiming the priority of the earlier Japanese patent applications No. 2007-104828 filed on Apr. 12, 2007 and No. 2008-052165 filed on Mar. 3, 2008, the entire disclosure thereof being incorporated herein by reference thereto.

FIELD OF THE INVENTION

This invention relates to a semiconductor memory device. More particularly, the invention relates to a semiconductor memory device adapted for testing of a cell having a plurality of ports, and to a method of testing a semiconductor memory device.

BACKGROUND OF THE INVENTION

FIG. 4 is a diagram illustrating the configuration of a SRAM (Static Random-Access Memory) cell of a dual-port static memory circuit in which each cell is composed of eight transistors. As shown in FIG. 4, the memory cell includes a PMOS transistor Q2 (a load) and an NMOS transistor Q1 (a driver transistor) connected in series between a first power supply VDD and a second power supply VSS, and a PMOS transistor Q4 (a load) and an NMOS transistor Q3 (a driver transistor) connected in series between the power supplies VDD and VSS. Commonly coupled drains (N1) of the PMOS transistor Q2 and NMOS transistor Q1 are connected to commonly coupled gates of the PMOS transistor Q4 and NMOS transistor Q3, and commonly coupled drains (N2) of the PMOS transistor Q4 and NMOS transistor Q3 are connected to commonly coupled gates of the PMOS transistor Q2 and NMOS transistor Q1. Provided between the node N1 and bit lines DTA and DTB are A-port and B-port access transistors Q5 and Q6 whose gates are connected to word lines WLA and WLB, respectively, and provided between the node N2 and complementary bit lines DBA and DBB are A-port and B-port access transistors Q7 and Q8 whose gates are connected to the word lines WLA and WLB, respectively.

In the dual-port static memory circuit having the SRAM cell illustrated in FIG. 4, each of the ports A and B is used as an I/O port where reading and writing are performed (in which case the two ports are capable of simultaneous READ). The port A may be used as a write-only port and the port B may be used as a read-only port (or vice versa). With regard to a multiport memory circuit, refer also to the description in Patent Document 1.

[Patent Document 1] Japanese Patent Kokai Publication No. JP-A-1-296486

The following analysis is given by the present invention. The disclosures of the above-mentioned Patent Document are herein incorporated by reference thereto, and regarded as part of the disclosure of the present invention.

The problem with the dual-port static memory circuit having the SRAM cell shown in FIG. 4 is that the memory cannot be tested in the worst case with regard to operating margin. This will now be described. It should be noted that the description that follows is based upon the results of analysis conducted by the Inventor.

In FIG. 4, there is illustrated an example of operation of the SRAM cell in a case where the ports A and B are read simultaneously, in which currents Icell_A and Icell_B flow simultaneously from the bit lines DTA and DTB to the driver transistor Q1 within the SRAM cell. In a case where the same row is accessed by the ports A and B simultaneously, the word lines WLA and WLB of both ports A and B go HIGH simultaneously. Hence, port A access transistors Q5 and Q7 and port-B access transistors Q6 and Q8 turn on simultaneously. It should be noted that in the configuration shown in FIG. 4, it is assumed that the bit-line pairs (DTA, DBA) and (DTB, DBB) of both ports were pre-charged to the HIGH level before activation of the select word line.

Since the driver transistor Q1 in the SRAM cell have to pull-down both bit lines DTA and DTB of ports A and B to the LOW level, the pull-down characteristic of bit lines DTA and DTB is deteriorated in comparison with a case where the bit line of one port is pulled down to the LOW level. Consequently, the value of bit-line difference potential [$\Delta$VBL: difference potential between bit-line pair (DTA, DBA) and between bit-line pair (DTB, DBB)] read by a sense amplifier (not shown) is reduced so that operating margin decreases and minimum operating voltage worsens.

The longer becomes a period of time in which the ON states of the port A and port-B access transistors Q5 and Q6 overlap, the greater becomes the extent of the decline in the value of the bit-line difference potential $\Delta$VBL. Accordingly, the time at which the potentials at the word lines of both ports rise simultaneously is the point at which the cell-data read margin is most severe and the minimum operating voltage is at its worst value.

FIG. 5A is a graph illustrating the relationship between a difference $\Delta t$ [$=t(WLA-WLB)$] between rise timings of the word lines WLA and WLB of the ports A and B and the bit-line difference potential $\Delta$VBL (V|DTA−DBA|, V|DTB−DBB|). It will be appreciated that in a case where the rise timings of the word lines WLA and WLB of the ports A and B overlap (see FIG. 5C), $\Delta$VBL is minimum (see the valley of $\Delta$VBL in FIG. 5A).

Specifically, when one bit line of the bit-line pairs is HIGH based upon the cell data, the driver transistor of the SRAM cell discharges the other bit line of the bit-line pairs to the LOW level. However, in a case where the other bit lines (e.g., DTA, DTB) of the bit line pairs of ports A and B are pulled down to LOW simultaneously by one driver transistor, the potential difference between the bit-line pairs diminishes and the speed of enlarging the potential difference becomes slow, as illustrated in FIG. 5C, in comparison with a case where just the bit line of one port is pulled down to the LOW level, from the standpoint of the current driving capability of the driver transistor. By contrast, if the timings at which the word lines WLA and WLB of ports A and B are activated (namely the rise timings) are shifted forward or backward in terms of time, the bit-line difference potential $\Delta$VBL is large (see FIG. 5B).

A test of a memory device conducted prior to shipment thereof, should employ worst case testing in which the bit-line difference potential $\Delta$VBL is minimum.

However, for the following two reasons, a case occurs where the word lines of both ports cannot be driven at the same timing and the operating margin does not exhibit its worst value:

(a) owing to variations between elements in a chip, skew (a shift in timing) occurs between ports in the path from a BIST (Build-In Self-Test) apparatus to the memory; and (b) skew of an internal clock for activating a word line, ascribable to the physical layout in the memory, occurs. This will be described below in further detail with reference to the drawings.

FIG. 6 illustrates a typical example of the configuration of a word-line control unit in a static memory circuit having the SRAM cell shown in FIG. 4. Shown in FIG. 6 is an example of the configuration of a clock-synchronized dual-port static memory circuit in which word-line activation timing is controlled based upon an input clock signal.

With reference to FIG. 6, clock signals CLKA and CLKB supplied to clock terminals (A) and (B), respectively, are received by buffers 101 and 102, respectively, and internal clock signals ICLA and ICLB are output from the buffers 101 and 102, respectively.

XKA and XEA of address select signals (A) (row address) that select word line WLA of port A are outputs of a main pre-decoder (not shown) and a sub pre-decoder (not shown) of an X-address decoder (row-address decoder) for port A, respectively.

XKB and XEB of address select signals (B) (row address) that select word line WLB of port B are outputs of a main pre-decoder (not shown) and a sub pre-decoder (not shown) of an X-address decoder (row-address decoder) for port B, respectively.

There are provided a NAND gate 103 that receives XKA and XEA of the address select signal (A), and a CMOS transfer gate 105 comprising a PMOS transistor having a gate at which the output of the NAND gate 103 is received, and an NMOS transistor having a gate that receives a signal that is the result of inverting the output of the NAND gate 103 by an inverter 104. When XKA and XEA are both HIGH, the output of the NAND gate 103 is LOW. As a result, the CMOS transfer gate 105 turns on and transfers the internal clock signal ICLA, and the word line WLA is raised to the high potential by an inverter 107 and an inverting buffer (inverting-type word driver) 108. In a case where XKA and XEA are both other than HIGH (i.e., in a case where either one is LOW), the output of the NAND gate 103 goes HIGH, an NMOS transistor 106 turns on, the input to the inverter 107 is fixed at the LOW level and the word line WLA is set to the LOW level. The period of time during which the select word line is activated corresponds to the duration of the HIGH pulse of the internal clock signal ICLA. The configuration is similar with regard to the address select signal (B) of port B.

FIG. 7 is a diagram schematically illustrating a test of a static memory circuit by BIST. In FIG. 7, IOA and IOB each include a write amplifier (not shown) and a sense amplifier (not shown) for respectively writing and reading data of port A and port B of a SRAM cell array (SRAM CELL). Control units CNTA and CNTB receive clock signals CLKA and CLKB and perform timing control of selected word lines of port A and port B, respectively. WLDA and WLDB include X-address decoders for decoding row addresses of port A and port B, respectively and word drivers for driving select word lines of port A and port B, respectively. When the test is conducted, clock signals from a BIST circuit 202 are distributed via clock distribution paths (clock buffer groups 203 and 204) and arrive at respective clock terminals CLKA and CLKB of port A and port B of a memory circuit 201.

In this case, a clock skew is generated between the ports A and B owing to parameter variations betweens the BIST circuit 202 and memory circuit 201.

Further, a skew between the internal clocks of the two ports is generated owing to the physical layout within the memory circuit 201. For example, since the path of the clock from the clock terminal CLKA to the word line WLA has a path length different from the path of the clock from the clock terminal CLKB to the word line WLB, a skew is generated between the internal clocks ICLA and ICLB.

For these reasons, it is difficult to realize a test in which the word line WLA of the port A and the word line WLB of the port B are made to rise simultaneously.

Further, even in a case where a memory device is tested using not a BIST circuit but test by a tester that has a skew between pins calibrated, similar problems arise owing to a skew between the internal clocks of the two ports ascribable to the physical layout within the memory circuit and a skew between clock terminals of the ports A and B of the memory circuit 201 within the semiconductor device.

In a memory device provided with a cell including a plurality of ports in accordance with the related art, it is difficult to exercise control so as to cause word lines of a plurality of ports to rise simultaneously when the device is tested, as set forth above. This means that the device cannot be tested in the worst state. As a result, pass/fail decision accuracy (measurement precision) is limited, and this leads to a limitation on an improvement in product yield and reliability.

SUMMARY OF THE DISCLOSURE

The invention disclosed in this application has the following configuration. It should be noted that what is indicated by the reference characters within the parentheses in the following description represent examples in order to clarify the present invention and should not be interpreted as limiting the present invention.

According to a first aspect of the present invention, there is provided a semiconductor memory device that comprises:

a memory cell including a plurality of ports:

a plurality of test control signals provided respectively in correspondence with a plurality of timing signals for controlling respective timings of activation of word lines of the plurality of ports; and a control circuit that with regard to the cell with the plurality of ports thereof being selected, when one test control signal among the plurality of test control signals corresponding to respective ones of the selected plurality of ports is in an activated state and remaining test control signals are in a deactivated state, exercises control so as to mask the timing signals corresponding to the test control signals in the deactivated state and to activate the word lines of the selected plurality of ports responsive to the one timing signal corresponding to the one test control signal in the activated state.

In the semiconductor memory device according to the present invention, when all of the plurality test control signals corresponding to the selected plurality of ports are in the deactivated state, the word lines of the plurality of ports are activated independently in response to respective ones of the plurality of timing signals corresponding to respective ones of the plurality of test control signals.

A semiconductor memory device according to another aspect of the present invention is provided with a memory cell connected to word lines (WLA, WLB) of at least first and second ports, control of timing of activation of the word lines of the first and second ports being performed based upon first and second clock signals (CLKA and CLKB), respectively, and the device being provided with first and second test control signals (TESTA, TESTB) in correspondence with the first and second clock signals that control the respective timings of activation of the word lines of the first and second ports. With regard to the memory cell for which the first and second ports are selected, when the first test control signal is in an activated state and the second test control signal is in a deactivated state, control is exercised so as to mask the second clock signal and, in response to the first clock signal, activate the first and second word lines; and when the second test control signal is in an activated state and the first test control signal is in a deactivated state, control is exercised so as to mask the first clock signal and, in response to the second clock signal, activate the first and second word lines.

In the semiconductor memory device according to the present invention, with regard to the memory cell for which the first and second ports are selected, when the first and second test control signals are both in the deactivated state, control of activation of the first and second word lines is performed independently by respective ones of the first and second clock signals.

The semiconductor memory device according to the present invention further includes: a first circuit (11, 12), which receives the first clock signal and the second test control signal as inputs, for outputting the first clock signal as a first internal clock signal when the second test control signal is in the deactivated state, and fixing the first internal clock signal to the deactivated state without transferring the first clock signal when the second test control signal is in the activated state; a second circuit (13, 14), which receives the second clock signal and the first test control signal as inputs, for outputting the second clock signal as a second internal clock signal when the first test control signal is in the deactivated state, and fixing the second internal clock signal to the deactivated state without transferring the second clock signal when the first test control signal is in the activated state; a first switch (transfer gate) (17), which receives the first internal clock signal (ICLA) from the first circuit (11, 12), for turning on and transferring out the first internal clock signal when an address select signal (XKA and XEA) of the first port is in the selected state;

a second switch (24), which receives the second internal clock signal (ICLB) from the second circuit (13, 14), for turning on and transferring out the second internal clock signal when an address select signal (XKB, XEB) of the second port is in the selected state;

a first logic circuit (19), which receives the second test control signal (TESTB) and the output signal of the second switch (transfer gate) (24) as inputs, for outputting a signal in the deactivated state when one or both or both of these inputs is in the deactivated state, and outputting a signal in the activated state when both inputs are in the activated state;

a second logic circuit (20) that receives the output signal of the first logic circuit (19) and the output signal of the first switch (17) as inputs, wherein when one of these inputs is in the deactivated stage, the other of these inputs is output;

a first word driver (21), which, responsive to the output signal of the second logic circuit (20), drives the word line of the first port;

a third logic circuit (26) that receives the first test control signal (TESTA) and the output signal of the first switch (17) as inputs, for outputting a signal in the deactivated state when one or both or both of these inputs is in the deactivated state, and outputting a signal in the activated state when both inputs are in the activated state;

a fourth logic circuit (27) that receives the output signal of the third logic circuit (26) and the output signal of the second switch (24) as inputs, wherein when one of these inputs is in the deactivated stage, the other of these inputs is output; and a second word driver (28), which, responsive to the output of the second logic circuit, drives the word line of the second port.

In the present invention, the first logic circuit and the third logic circuit each comprise a 2-input AND gate, the second logic circuit and the fourth logic circuit each comprise a 2-input NOR gate, and the first word driver and second word driver each comprise an inverting driver.

In the present invention, the memory cell comprises a static-type cell that includes: two inverters (Q1, Q2), (Q3, Q4) having inputs and outputs cross-connected at first and second nodes (N1, N2 in FIG. 4); first and second access transistors (Q5, Q6) inserted between the first node (N1) and bit lines (DTA, DTB) of the first and second ports, respectively, and having control terminals connected to word lines of the first and second ports, respectively; and third and fourth access transistors (Q7, Q8) inserted between the second node (N2) and complementary bit lines (DBA, DBB) of the first and second ports and having control terminals connected to word lines of the first and second ports, respectively.

In the first aspect of the present invention, entered clock signals are used as the timing signals, and selected word lines are activated in response to the clock signals. In the activation of word lines in the same row, if the test control signal of one port of the first and second ports has been activated, the word line of the other port also is driven at a timing identical with the timing of activation of the word line of the one port.

According to a further aspect of the present invention, there is provided a method of testing a semiconductor memory device having a memory cell connected to word lines of at least first and second ports, comprising:

preparing first and second test control signals in correspondence with first and second clock signals for controlling respective timings of activation of the word lines of the first and second ports;

with regard to the cell for which the first and second ports are selected, when the first test control signal is in an activated state and the second test control signal is in a deactivated state, masking the second clock signal, activating the first and second word lines at the same timing in response to the first clock signal and reading cell data from bit lines of the first and second ports simultaneously; and when the second test control signal is in an activated state and the first test control signal is in a deactivated state, masking the first clock signal, activating the first and second word lines at the same timing in response to the second clock signal and reading cell data from bit lines of the first and second ports simultaneously.

In the present invention, there is provided a semiconductor memory device comprising: a cell connected to a plurality of word lines corresponding respectively to a plurality of ports: and a control circuit that controls to activate respective world lines corresponding to the plurality of ports, responsive to respective ones of a plurality of timing signals corresponding respectively to the plurality of ports; wherein said control circuit, in accordance with a test control signal supplied thereto, activates said plurality of word lines responsive to an associated one of the timing signals.

In the present invention, there is provided a semiconductor memory device comprising: a cell connected to at least first and second word lines corresponding respectively to first and second ports; and a control circuit that activates the first word line corresponding to the first port responsive to a first clock signal and activating the second word line corresponding to the second port responsive to a second clock signal;

said control circuit in accordance with a test control signal supplied thereto, activating said first and second word lines based on said first clock signal or said second clock signal.

In accordance with the present invention, when a semiconductor memory device is tested, the word lines of a plurality of ports can be activated at the same timing and a worst-case test is made possible. As a result, test precision is improved, and this contributes to improvements in product yield and reliability.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The above and other objects, advantages and features of the present invention will be more apparent from the following description of certain preferred modes taken in conjunction with the accompanying drawings, in which:

FIGS. 5A to 5C show a diagram for describing a problem encountered in simultaneous READ in a SRAM cell;

PREFERRED MODES OF THE INVENTION

Preferred modes of the present invention will be described in detail with reference to the accompanying drawings.

A semiconductor memory device according to the present invention includes a cell having a plurality of ports. A plurality of test control signals (TESTA, TESTB) are provided in correspondence with a plurality of timing signals (e.g., clock signals CLKA and CLKB) for controlling respective ones of timings of activation of word lines of the plurality of ports. With regard to the cell with the plurality of ports being selected, when one test control signal among the plurality of test control signals corresponding to respective ones of the selected plurality of ports is in an activated state (enabled) and the remaining test control signals are in a deactivated state (disabled), control is exercised so as to mask the timing signals corresponding to the test control signals in the deactivated state and, in response to the one timing signal corresponding to the one test control signal in the activated state, activate the word lines (e.g., WLA and WLB) of the selected plurality of ports. If, in a case where the present invention is applied to a dual-port clock-synchronized static memory circuit in which each port functions as an I/O port, the test control signal for one port of the first and second ports is in the activated state (enabled) in the activation of word lines in the same row, then the rise timing of the word line of the other port also is controlled to be the same as that of the word line of the one port.

In the present invention, it is so arranged that when the test control signal of one port is in the activated state (enabled), the internal clock of the other port is controlled not to be raised. With such an arrangement, when a memory test is conducted using a BIST circuit or the like, it is possible to conduct the test under the worst-case condition in terms of the operating margin. That is, when the same row is accessed by ports A and B simultaneously and the selected word lines of ports A and B are raised simultaneously, data-read margin declines to the maximum degree and the minimum driving voltage falls to its worst value. For example, by adopting an arrangement in which the word lines of ports A and B are driven at the same timing only by the clock signal of port A, a state in which operating margin always is reduced to the worst condition can be achieved without taking into consideration the effects of a clock skew between ports from the BIST circuit to the memory and internal clock skew due to the physical layout within the memory. Although no limitation is imposed on the present invention, in an example described below, the present invention is applied to a clock-synchronized static memory circuit in which the memory cell comprises a dual-port SRAM shown in FIG. 4 and activation of word lines is controlled based upon clock signals.

Figure 1:
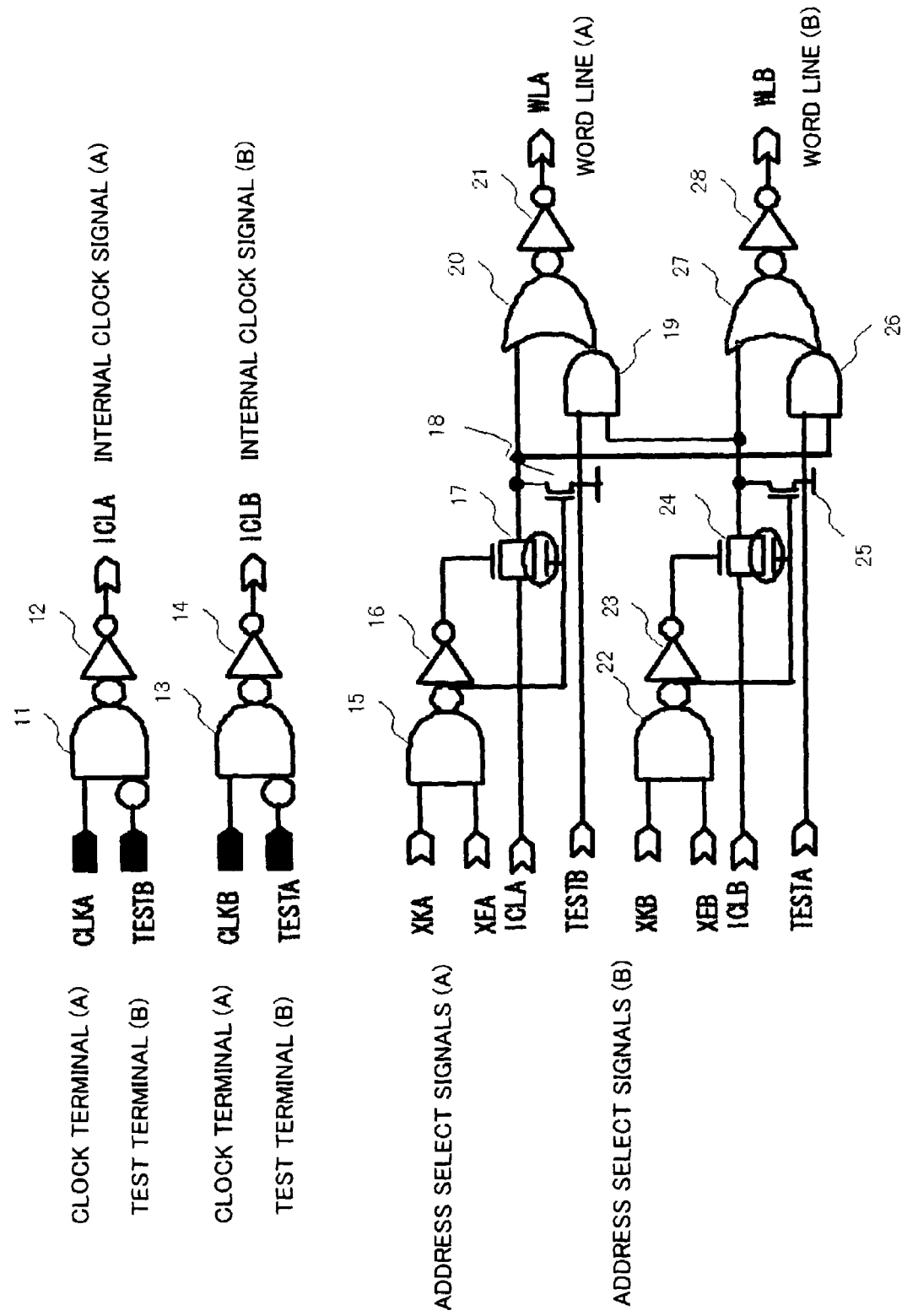
FIG. 1 is a diagram illustrating an exemplary embodiment of the present invention.

An example of the present invention will now be described. FIG. 1 is a diagram illustrating the configuration of a circuit (X-address decoder and word driver) for controlling activation of word lines according to an example of the present invention.

With reference to FIG. 1, the circuit includes a 2-input NAND gate 11 having its inputs connected to a clock terminal (A) to which a clock signal CLKA is supplied and to a port-B test terminal (TESTB), and an inverting buffer 12 for receiving the output of the NAND gate 11. The inverting buffer 12 outputs an internal clock signal ICLA.

In terms of circuit operation, when the port-B test control signal TESTB is LOW (the input of the port-B test control signal TESTB to the NAND gate 11 is active when LOW), the NAND gate 11 outputs a signal that is the result of inverting the port A clock signal CLKA and the inverting buffer 12 outputs an internal clock signal (A) ICLA that is in phase with the clock signal CLKA. When the port-B test control signal TESTB is HIGH, the output of the NAND gate 11 is fixed at the HIGH level (the clock signal CLKA is masked) irrespective of the value of the clock signal CLKA, and the internal clock signal ICLA from the inverting buffer 12 is fixed at the LOW level.

The circuit further includes a 2-input NAND gate 13 having its inputs connected to a clock terminal (B) to which a clock signal CLKB is supplied and to a port A test terminal (TESTA), and an inverting buffer 14 for receiving the output of the NAND gate 13. The inverting buffer 14 outputs an internal clock signal ICLB.

In terms of circuit operation, when the port A test control signal TESTA is LOW (the input of the port A test control signal TESTA to the NAND gate 13 is active when LOW), the NAND gate 13 outputs a signal that is the result of inverting the port-B clock signal CLKB and the inverting buffer 14 outputs an internal clock signal (B) ICLB that is in phase with the clock signal CLKB. When the port A test control signal TESTA is HIGH, the output of the NAND gate 13 is fixed at the HIGH level (the clock signal CLKB is masked) irrespective of the value of the clock signal CLKB, and the internal clock signal ICLB from the inverting buffer 14 is fixed at the LOW level.

Further provided as a circuit for controlling drive of the word line WLA of port A are a 2-input NAND gate 15 that receives XKA and XEA, which are port A address signals (A); a CMOS transfer gate 17 comprising a PMOS transistor having a gate at which the output of the NAND gate 15 is received, and an NMOS transistor having a gate that receives a signal that is the result of inverting the output of the NAND gate 15 by an inverter 16; and an NMOS transistor 18 having a drain connected to the output of the CMOS transfer gate 17, a source connected to power supply VSS and a gate connected to the output of the NAND gate 15. Further provided are a 2-input AND gate 19 having its inputs connected to the port-B test control signal TESTB and to the output of a CMOS transfer gate 24 (described later); a 2-input NOR gate 20 that receives the output of the CMOS transfer gate 17 and the output of the AND gate 19; and an inverting word driver 21 that receives the output of the NOR gate 20. It should be noted that XKA and XEA of the address select signals (A) are address select signals output as a result of decoding of an X address present in a pre-decoder (not shown).

In terms of circuit operation, when XKA and XEA are both HIGH, the output of the NAND gate 15 is LOW and the CMOS transfer gate 17 turns on and transfers out the entered internal clock signal ICLA. When at least one of XKA and XEA is LOW (i.e., at non-selection of the port A address of the cell), the output of the NAND gate 15 is high, the CMOS transfer gate 17 turns off, the NMOS transistor 18 turns on and the output of the CMOS transfer gate 17 is set to the LOW level.

For example, when the port-B test control signal TESTB is LOW, the output of the AND gate 19 is LOW and the NOR gate 20 supplies the inverting word driver 21 with a signal obtained by inverting ICLA, which is the output of the CMOS transfer gate 17.

On the other hand, when the port-B test control signal TESTB is HIGH (ICLA is fixed at the LOW level at this time), the NOR gate 20 supplies the inverting word driver 21 with a signal obtained by inverting the output of the AND gate 19. The inverting word driver 21 receives a LOW pulse (a signal the phase of which is opposite that of ICLB) from the NOR gate 20 and drives the word line WLA.

Further provided as a circuit for controlling drive of the word line WLB of port B are a 2-input NAND gate 22 that receives XKB, XEB, which are port-B address signals (B); a CMOS transfer gate 24 comprising a PMOS transistor having a gate at which the output of the NAND gate 22 is received, and an NMOS transistor having a gate that receives a signal that is the result of inverting the output of the NAND gate 22 by an inverter 23; and an NMOS transistor 25 having a drain connected to the output of the CMOS transfer gate 24, a source connected to power supply VSS and a gate connected to the output of the NAND gate 22. Further included are a 2-input AND gate 26 having its inputs connected to the port A test control signal TESTA and to the output of THE CMOS transistor 17; a 2-input NOR gate 27 that receives the output of the CMOS transfer gate 24 and the output of the AND gate 26; and an inverting word driver 28 that receives the output of the NOR gate 27. It should be noted that XKB, XEB of the address select signals (B) are address select signals output as a result of decoding of an X address present in a pre-decoder (not shown).

In terms of circuit operation, when XKB and XEB are both HIGH, the output of the NAND gate 22 is LOW and the CMOS transfer gate 24 turns on and transfers out the entered internal clock signal ICLB. When at least one of XKB and XEB is LOW (i.e., at non-selection of the port-B address of the cell), the output of the NAND gate 22 is HIGH, the CMOS transfer gate 24 turns off, the NMOS transistor 25 turns on and the output of the CMOS transfer gate 24 is sent to the LOW level.

For example, when the port A test control signal TESTA is LOW, the output of the AND gate 26 is LOW and the NOR gate 27 supplies the inverting word driver 28 with a signal obtained by inverting ICLB, which is the output of the CMOS transfer gate 24.

On the other hand, when the port A test control signal TESTA is HIGH (ICLA is fixed at the LOW level at this time), the NOR gate 27 supplies the inverting word driver 28 with a signal obtained by inverting the output of the AND gate 26. The inverting word driver 28 receives a LOW pulse (a signal the phase of which is opposite that of ICLB) from the NOR gate 27 and drives the word line WLB.

It should be noted that at the time of normal operation or in cases other than one in which a simultaneous READ test of ports A and B is conducted at the time of a test, the test control signals TESTA, TESTB are both set to the LOW level, timing of activation of the word line WLA is controlled via ICLA, the CMOS transfer gate 17 and the NOR gate 20, and timing of activation of the word line WLB is controlled via ICLB, the CMOS transfer gate 24 and the NOR gate 27 (the word line WLB is controlled independently of the word line WLA). Setting both of the test control signals TESTA, TESTB to the HIGH level is inhibited.

Figure 2:
FIG. 2 is a timing chart for describing operation of the exemplary embodiment.

FIG. 2 is a diagram useful in describing the timing operation of the exemplary embodiment illustrated in FIG. 1. Operation of the circuit shown in FIG. 1 will now be described with reference to FIG. 2.

<Independent Operation>

When TESTA and TESTB are both at the LOW level (see "INDEPENDENT OPERATION" in FIG. 2), the NAND gates 11 and 13 output signals obtained by inverting CLKA and CLKB, respectively, and internal clock signals in phase with CLKA and CLKB are output as ICLA and ICLB, respectively.

Since TESTB is LOW, the output of the AND gate 19 is fixed at the LOW level. When XKA and XEA are HIGH, the NOR gate 20 outputs a signal that is the inverse of ICLA, which is output from the CMOS transfer gate 17, and the word line (A) WLA of port A is activated in sync with the clock ICLA and, hence, in sync with CLKA.

Since TESTA is LOW, the output of the AND gate 26 is fixed at the LOW level. When XKB and XEB are HIGH, the NOR gate 27 outputs a signal that is the inverse of ICLB, which is output from the CMOS transfer gate 24, and the word line (b) WLB of port B is activated in sync with the clock ICLB and, hence, in sync with CLKB. That is, the word lines of ports A and B are controlled independently of each other.

<Simultaneous READ: A-Port Test>

When TESTA is HIGH and TESTB is LOW (see "A-PORT TEST" in FIG. 2), the output of the NAND gate 13 goes HIGH and ICLB is fixed at the LOW level irrespective of the value at the clock terminal CLKB. The output of the AND gate 19 is fixed at the LOW level. Therefore, when XKA and XEA are HIGH, the NOR gate 20 outputs a signal that is the inverse of ICLA, which is output from the CMOS transfer gate 17, and the word line (A) WLA of port A is activated in sync with the clock ICLA and, hence, in sync with CLKA. Further, ICLB is fixed at the LOW level. When XKB and XEB are HIGH, the NOR gate 27 outputs the inverted signal of the AND gate 26. When ICLA is HIGH, the AND gate 26 goes HIGH and the word driver 28 places the word line WLB at the HIGH level. That is, the word line WLB rises at the same time as the word line WLA and the read data is output simultaneously to the bit-line pair DTA/DBA of the A port and to the bit-line pair DTB/DBB of the B port. This is the worst-case condition of simultaneous READ described above with reference to FIG. 5.

<Simultaneous READ: B-Port Test>

When TESTB is HIGH and TESTA is LOW (see "B-PORT TEST" in FIG. 2), the output of the NAND gate 11 goes HIGH and ICL1 is fixed at the LOW level irrespective of the value at the clock terminal CLKA. The output of the AND gate 26 is fixed at the LOW level. Therefore, when XKB and XEB are HIGH, the NOR gate 27 outputs a signal that is the inverse of ICLB, which is output from the CMOS transfer gate 24, and the word line (B) WLB of port B is activated in sync with the clock ICLB and, hence, in sync with CLKB. Further, ICLA is fixed at the LOW level. When XKA and XEA are HIGH, the NOR gate 20 outputs the inverted signal of the AND gate 19. When ICLB is HIGH, the AND gate 19 goes HIGH and the word driver 21 places the word line WLA at the HIGH level. That is, the word line WLA rises at the same time as the word line WLB and the read data is output simultaneously to the bit-line pair DTB/DBB of the B port and to the bit-line pair DTA/DBA of the A port. This is the worst-case condition of simultaneous READ described above with reference to FIG. 5.

Thus, this example is such that in control for activating word lines in the same row, logic between a test control signal of a first port and a word-line activating signal of a second port is added on. If the test control signal of the first port is enabled, then the word line on the side of the second port also is driven at a signal transition timing exactly the same as that of activation of the word line on the side of the first port. In a case where the logic between a test control signal of the first port and an externally input clock signal of the second port is taken and the test control signal of the first port is enabled (HIGH), the internal clock of the second port is not output so as not to impede the driving of the word line of the second port.

Figure 3:
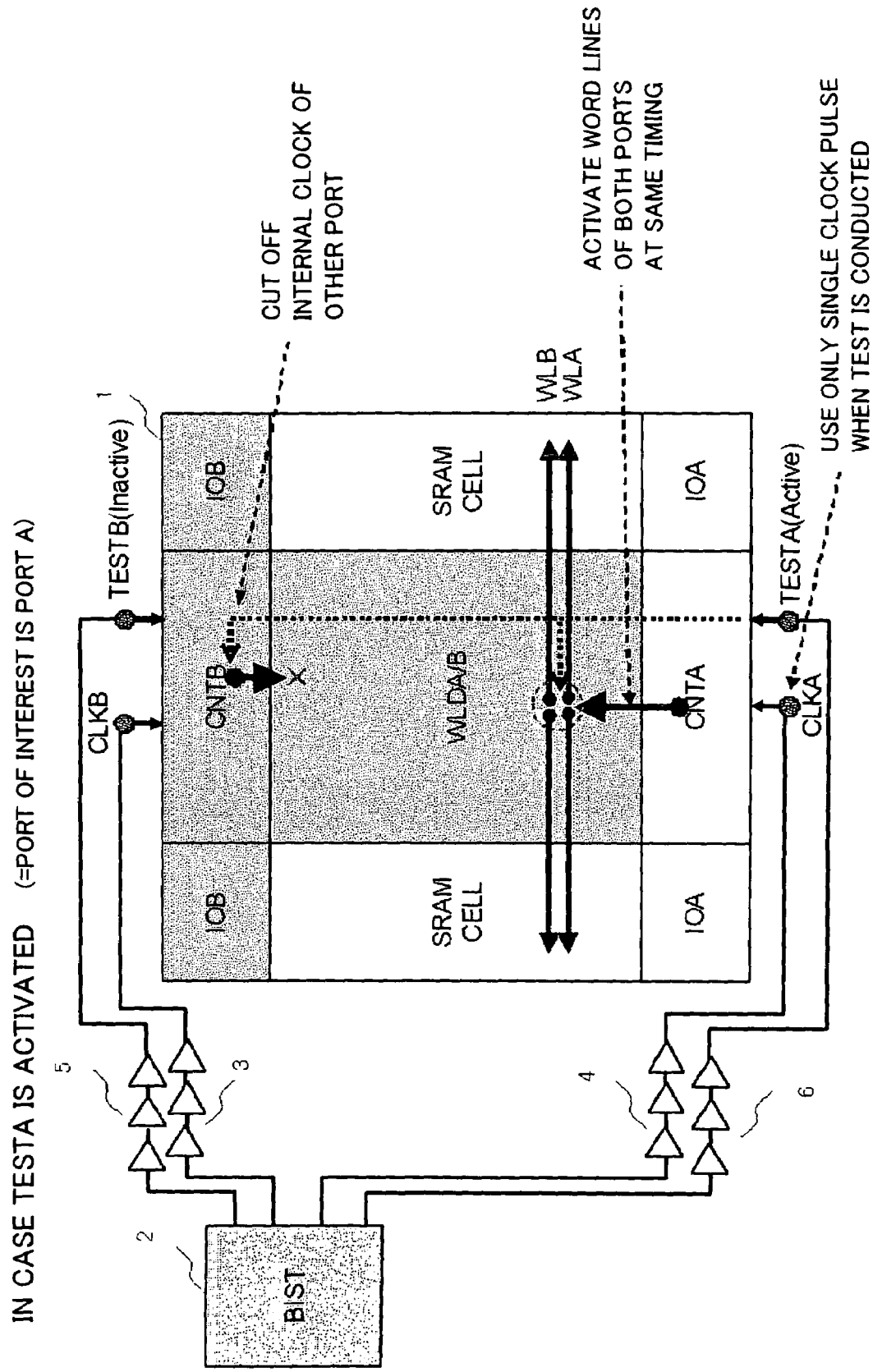
FIG. 3 is a diagram for describing a test according to this exemplary embodiment.
Figure 7:
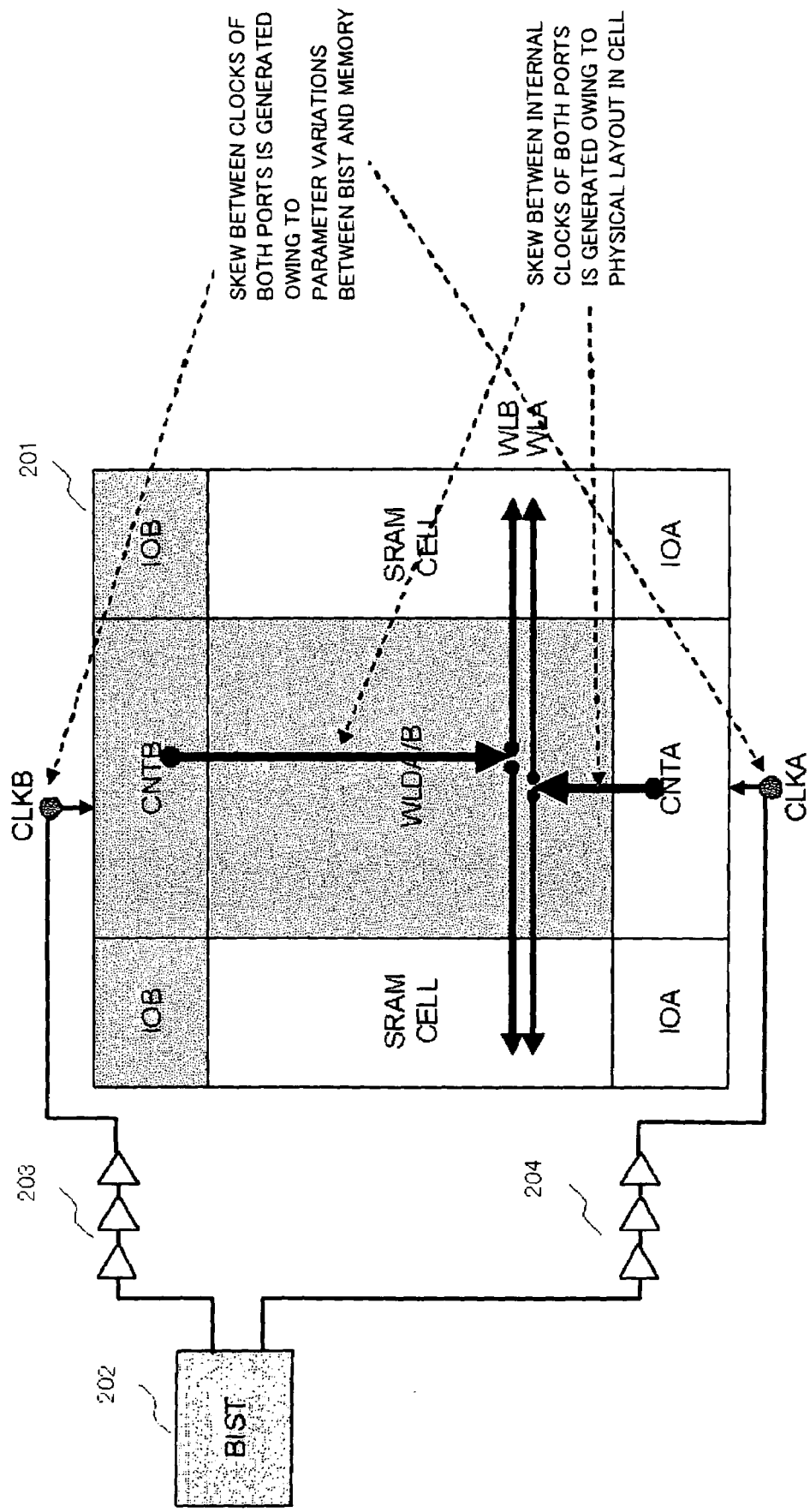
FIG. 7 is a diagram illustrating a test of a dual-port clock-synchronized static memory circuit.

FIG. 3 is a diagram illustrating the operation of this example of the present invention. This diagram corresponds to the arrangement shown in FIG. 7. A test control signal of the port of interest is set to the activated state (enabled), a clock is supplied to the port of interest, and in concurrence with the driving of the word line of the port of interest, the word line of the other port in the same row also is driven at the same timing to thereby subject the port of interest to a READ operation. The internal clock signal of the other port is fixed at the LOW level so as not to impede the driving of the word line of the other port even if a clock is supplied to the second port.

As shown in FIG. 3, the clock signal CLKA and the test control signal TESTA from a BIST circuit 2 are supplied to terminals CLKA and TESTA of port A of a memory circuit 1 via a clock buffer 4 and signal buffer 6, respectively and the clock signal CLKB and the test control signal TESTB from the BIST circuit 2 are supplied to terminals CLKB and TESTB of port B of a memory circuit 1 via a clock buffer 3 and signal buffer 5, respectively. In the example illustrated in FIG. 3, if the ports A and B of the selected cell are activated at the same timing, then TESTA is made HIGH, TESTB goes LOW and the word lines WLA and WLB of ports A and B are activated simultaneously using the clock CLKA for port A. The same clock (the clock from the clock terminal CLKA of port A) is supplied to the circuit (see FIG. 1) that controls the driving of the word lines WLA and WLB. Therefore, even if a skew exists between the internal clocks of the two ports owing to the physical layout in the memory circuit 1, the word lines WLA and WLB can be activated at the timings shown in FIG. 5C without being affected by the skew.

That is, in simultaneous READ of the two ports, the word lines of ports A and B are driven by the same clock. As a result, a clock skew between port A and port B owing to element-to-element variations between the BIST circuit 2 and the memory circuit 1 does not become a problem. Further, there is no influence from a skew between the internal clocks of two ports ascribable to the physical layout in the memory circuit 1.

Figure 8:
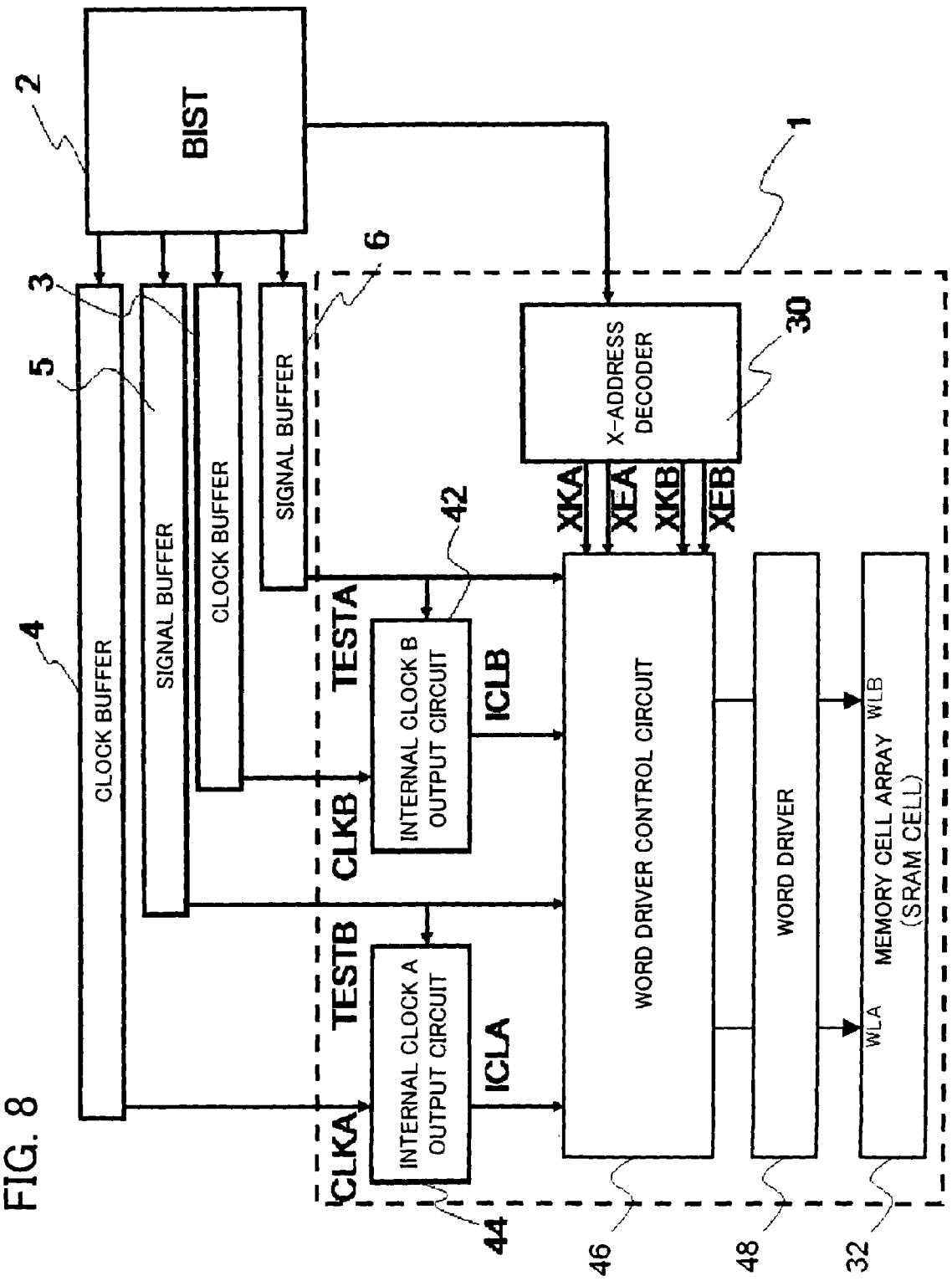
FIG. 8 is a diagram showing the configuration of exemplary embodiment of the present invention.

FIG. 8 is a block diagram illustrating the configuration according to an example of the present invention. Referring to FIG. 8, a memory circuit includes an internal clock B output circuit 42, an internal clock A output circuit 44, an X address decoder 30, a word driver control circuit 46 and a word driver 48. Meanwhile, in FIG. 8, the word driver control circuit 46 and the word driver 48 may be combined to form one block.

A BITS (Built In Self Test) circuit 2 provides respective clock signals for ports A and B via a clock buffer 3 and a clock buffer 4 to the memory circuit 1. The BITS circuit 2 also provides respective test signals for ports A and B via a signal buffer 5 and a signal buffer 6 to the memory circuit 1.

The internal clock A output circuit 44 is supplied with a clock signal CLKA for a port A and a test signal TESTB for a port B and outputs an internal clock ICLKA for a port A.

The internal clock B output circuit 42 is supplied with a clock signal CLKB for a port B and a test signal TESTA for a port A and outputs an internal clock ICLKB for a port B.

The address decoder 30 is supplied with an X address out of an address output from the BITS circuit 2 and outputs address select signals XKA and XEA for port A, and address select signals XKB and XEB for port B. A Y address out of an address output from the BITS circuit 2 is supplied to a column decoder not shown.

The word driver control circuit 46 is supplied with the internal clock signals ICLKA and ICLKB, the test control signals TESTA and TESTB, the address select signals XKA and XEA, and the address select signals XKB and XEB and outputs a signal controlling the activation of the selected word line.

The word driver 48 drives a word line WLA for a port A and a word line WLB for a port B for a selected cell in a memory cell array 32, based upon output signals from the word driver control circuit 46, respectively.

In FIG. 8, the internal clock A output circuit 44 is composed by for example the NAND 11 and inverter 12 in FIG. 1. The internal clock B output circuit 42 is composed by for example the NAND 13 and inverter 14 in FIG. 1. The word driver control circuit 46 is composed by for example the NAND 15, inverter 16, CMOS transfer gate 17, NMOS transistor 18, AND 19, NOR 20, NAND 22, inverter 23, CMOS transfer gate 24, NMOS transistor 25, AND 26 and NOR 27 in FIG. 1. The word driver 48 includes for example inverting drivers (inverters) 21 and 28 which drive the word lines WLA and WLB, respectively.

The above described example has the following effects:

By making it possible to test the memory circuit under the condition of worst operating margin at a test conducted, for example, before shipping of the product, the defect rate following shipment of the product may be reduced.

By making it possible to set the appropriate test specifications at a test conducted, for example, before shipping of the product, yield may be improved.

It goes without saying that by setting the test control signals TESTA and TESTB to the LOW level, the rising edges of the signals CLKA and CLKB may be imparted with a phase difference so that a test is conducted under conditions in which there is no overlap between the rise timings of the word lines WLA and WLB, as illustrated in FIG. 5B.

Figure 4:
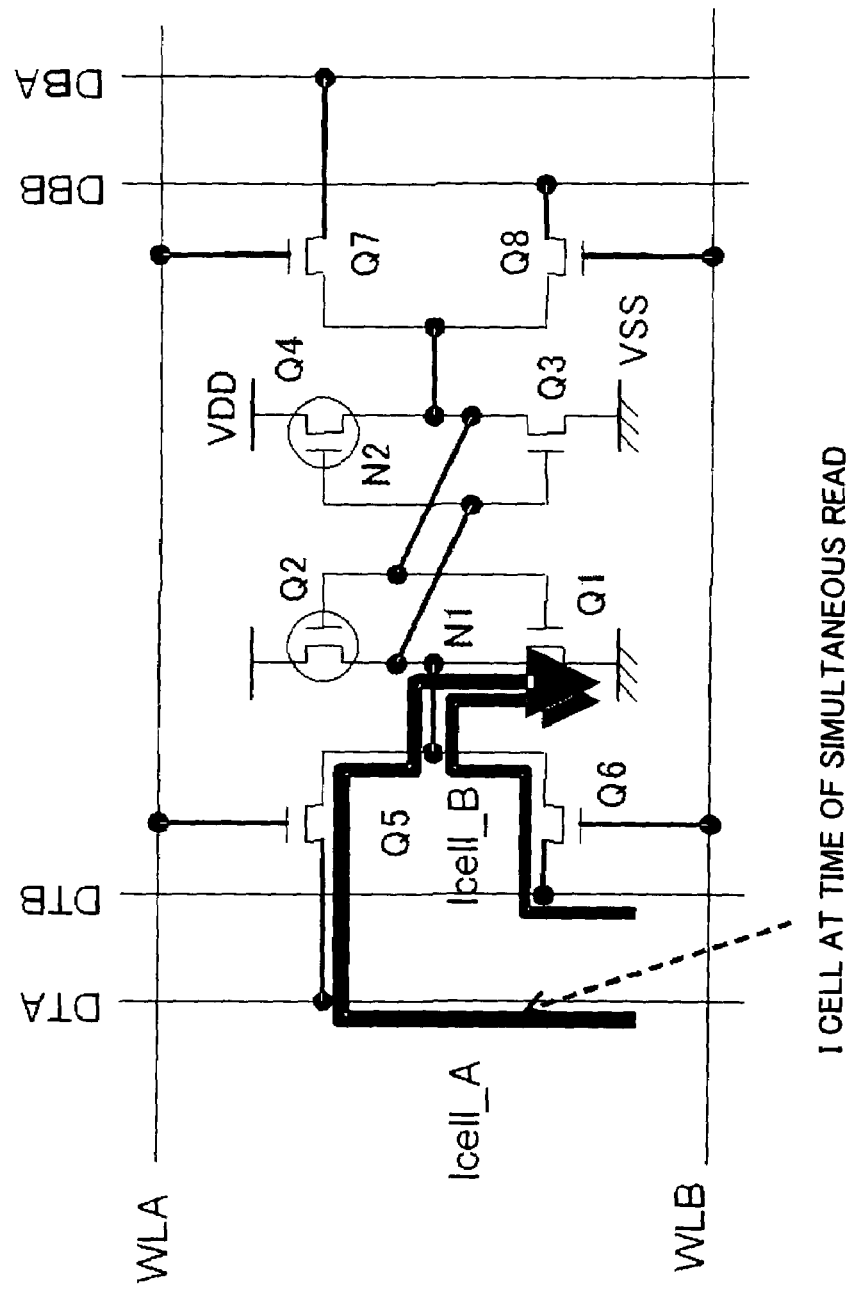
FIG. 4 is a diagram for describing simultaneous READ in an SRAM cell.
Figure 6:
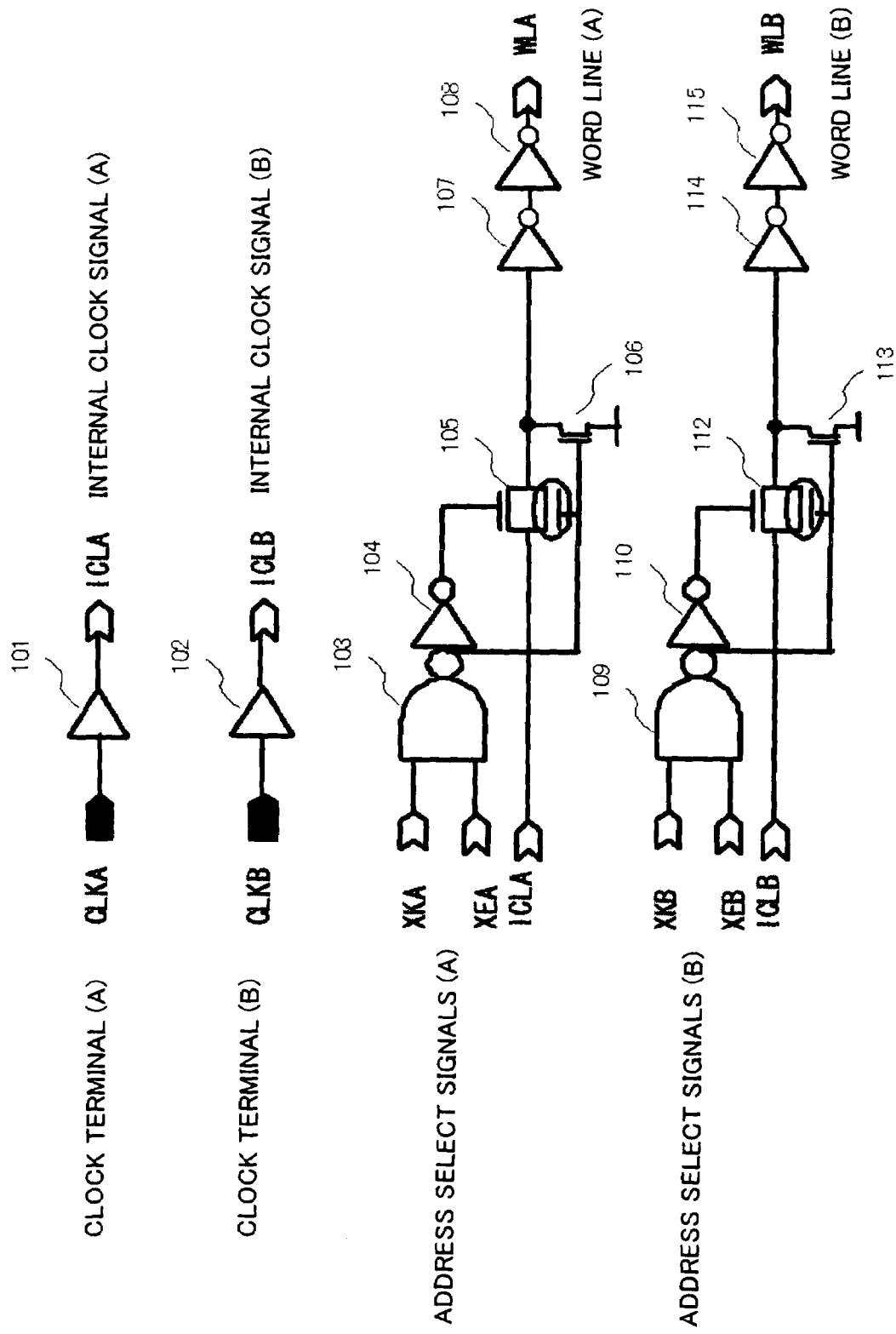
FIG. 6 is a diagram illustrating the configuration of a circuit for controlling word lines in a dual-port clock-synchronized static memory circuit.

The present invention is described with respect to the example in which the present invention is applied to a clock-synchronized static memory circuit having a dual-port SRAM cell described with reference to FIG. 4, in which each of the ports A and B is used as an I/O port at which read/write is performed, and simultaneous READ of ports A and B is made possible. As a matter of course, however, the static memory circuit may be such that port A is used as a write-only port and port B as a read-only port (or vice versa). Further, the present invention is not limited to the two port arrangement of ports A and B and is similarly applicable to a cell having more than two ports.

Though the present invention has been described in accordance with the foregoing exemplary embodiments, the invention is not limited to these exemplary embodiments and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
a memory cell connected to a plurality of word lines corresponding respectively to a plurality of ports; and
a control circuit that controls to activate selectively world lines corresponding respectively to the plurality of ports, responsive to respective ones of a plurality of timing signals corresponding respectively to the plurality of ports,
wherein the control circuit, in accordance with a test control signal supplied thereto, activates said plurality of word lines responsive to an associated one of the timing signals.

2. The semiconductor memory device according to claim 1, wherein the memory cell is connected to at least first and second word lines corresponding respectively to first and second ports;
first and second clock signals received being used as the timing signals;
the control circuit activating the first word line corresponding to the first port responsive to the first clock signal and activating the second word line corresponding to the second port responsive to the second clock signal;
the control circuit, in accordance with a test control signal supplied thereto, activating said first and second word lines, based on said first clock signal or said second clock signal.

3. The semiconductor memory device of claim 1, wherein the control circuit masks at least one of the timing signals that is not the associated one of the timing signals.

4. The semiconductor memory device of claim 1, wherein each of the timing signals comprises a clock signal.

5. The semiconductor memory device of claim 1, wherein the control circuit includes a timing control of activation of the word lines of the ports respectively performed based upon first and second clock signals, and
wherein first and second test control signals of the test control signal are prepared in accordance with the clock signals for respectively controlling the timings of activation of the word lines of the respective ports.

6. The semiconductor memory device of claim 1, wherein when one of the timing signals is masked at a test by the either one of the first and second test control signal in the activated state, then the activation of the respective word lines is simultaneously controlled by the other one of the test control signals.

7. The semiconductor memory device of claim 1, wherein at least two test control signals in respective correspondence with the clock signals are used to control respective timings of activation of the word lines of the ports.

8. The semiconductor memory device of claim 7, wherein the control circuit that, with regard to the memory cell with the ports being selected, when one of the at least two test control signals is in the activated state and the other of the at least two test control signals is in the deactivated state, exercises control to mask at least one of the timing signals and to activate at least one of the word lines responsive to another one of the timing signals.

9. A semiconductor memory device comprising:
a memory cell including a plurality of ports;
a plurality of test control signals provided respectively in correspondence with a plurality of timing signals for controlling respective timings of activation of word lines of the plurality of ports; and
a control circuit that with regard to the memory cell with the plurality of ports thereof being selected, when one test control signal among the plurality of test control signals corresponding to respective ones of the selected plurality of ports is in an activated state and remaining test control signals are in a deactivated state, exercises control to mask the timing signals corresponding to the test control signals in the deactivated state and to activate the word lines of the selected plurality of ports responsive to the one timing signal corresponding to the one test control signal in the activated state.

10. The semiconductor memory device according to claim 9, wherein, when all of the plurality of test control signals corresponding to the selected plurality of ports are in the deactivated state, the word lines of the plurality of ports are activated independently, responsive to respective ones of the plurality of timing signals corresponding to respective ones of the plurality of test control signals.

11. The semiconductor memory device according to claim 9,
wherein the memory cell is connected to word lines of at least first and second ports; and
there are provided first and second test control signals in correspondence with first and second clock signals used to control respective timings of activation of the word lines of the first and second ports; and wherein
the control circuit that, with regard to the memory cell with the first and second ports being selected,
when the first test control signal is in the activated state and the second test control signal is in the deactivated state, exercises control so as to mask the second clock signal and to activate the first and second word lines responsive to the first clock signal, and
when the second test control signal is in the activated state and the first test control signal is in the deactivated state, exercises control so as to mask the first clock signal and to activate the first and second word lines responsive to the second clock signal.

12. The semiconductor memory device according to claim 11, wherein, with regard to the memory cell with the first and second ports being selected, when the first and second test control signals are both in the deactivated state, the control circuit activates the first word line responsive to the first dock signal and activates the second word line responsive to the second clock signal.

13. The semiconductor memory device according to claim 12, further including:
a first circuit that receives the first clock signal and the second test control signal as inputs, and that outputs the first clock signal as a first internal clock signal when the second test control signal is in the deactivated state, and fixes the first internal clock signal to the deactivated state without transferring out the first clock signal when the second test control signal is in the activated state;
a second circuit that receives the second clock signal and the first test control signal as inputs, and that outputs the second clock signal as a second internal clock signal when the first test control signal is in the deactivated state, and fixes the second internal clock signal to the deactivated state without transferring out the second clock signal when the first test control signal is in the activated state;

a first switch that receives the first internal clock signal from the first circuit, and that turns on to transfer the first internal clock signal when an address select signal of the first port is in a selected state;

a second switch that receives the second internal clock signal from the second circuit, and that turns on to transfer the second internal clock signal when an address select signal of the second port is in a selected state;

a first logic circuit that receives the second test control signal and an output signal of the second switch as inputs, and that outputs a signal in a deactivated state when one or both or both of the inputs is in the deactivated state and outputs a signal in the activated state when both inputs are in the activated state;

a second logic circuit that receives an output signal of the first logic circuit and an output signal of the first switch as inputs, and that, when one of the inputs is in the deactivated state, outputs the other of the inputs;

a first word driver that, responsive to an output signal of the second logic circuit, drives the word line of the first port;

a third logic circuit that receives the first test control signal and the output signal of the first switch as inputs, and that outputs a signal in the deactivated state when one or both or both of the inputs is in the deactivated state, and outputs a signal in the activated state when both inputs are in the activated state;

a fourth logic circuit that receives an output signal of the third logic circuit and the output signal of the second switch as inputs, and that, when one of these inputs is in the deactivated state, outputs the other of the inputs; and a second word driver that, responsive to the output of the second logic circuit, drives the word line of the second port.

14. The semiconductor memory device according to claim 13, wherein the first logic circuit and the third logic circuit each comprise an AND gate;

the second logic circuit and the fourth logic circuit each comprise a NOR gate; and the first word driver and the second word driver each comprise an inverting driver.

15. The semiconductor memory device according to claim 9, wherein the memory cell comprises a static-type cell that includes:

two inverters having inputs and outputs cross-connected at first and second nodes;

first and second access transistors inserted between the first node and bit lines of the first and second ports, respectively, and having control terminals connected to word lines of the first and second ports, respectively; and third and fourth access transistors inserted between the second node and complementary bit lines of the first and second ports, respectively, and having control terminals connected to word lines of the first and second ports, respectively.

16. The semiconductor memory device according to claim 9, wherein clock signals received are used as the timing signals;

selected word lines are activated responsive to the clock signals; and in the activation of word lines in the same row, if the test control signal of one port of the first and second ports is activated, the word line of the other port also is driven at a timing identical with the timing of activation of the word line of said one port.

17. A method of testing a semiconductor memory device including a memory cell connected to word lines of at least first and second ports, the method comprising:

providing first and second test control signals in correspondence with first and second clock signals for controlling respective timings of activation of the word lines of the first and second ports;

with regard to the memory cell with the first and second ports being selected, when the first test control signal is in an activated state and the second test control signal is in a deactivated state, masking the second clock signal and, responsive to the first clock signal, activating the first and second word lines at a same timing and reading cell data from bit lines of the first and second ports simultaneously; and when the second test control signal is in the activated state and the first test control signal is in the deactivated state, masking the first clock signal and, responsive to the second clock signal, activating the first and second word lines at a same timing and reading cell data from bit lines of the first and second ports simultaneously.

* * * * *